US008477497B2

(12) United States Patent
Liu et al.

(10) Patent No.: US 8,477,497 B2
(45) Date of Patent: Jul. 2, 2013

(54) COOLING DEVICE FOR COOLING ELECTRONIC COMPONENTS

(75) Inventors: Yu-Ching Liu, Taipei Hsien (TW); Chi-An Yu, Taipei Hsien (TW); Xi-Hang Li, Shenzhen (CN); Bing Liu, Shenzhen (CN); Bo Xu, Shenzhen (CN); Jie-Peng Kang, Shenzhen (CN)

(73) Assignees: Fu Tai Hua Industry ( Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 275 days.

(21) Appl. No.: 12/949,783

(22) Filed: Nov. 19, 2010

(65) Prior Publication Data
US 2011/0299248 A1 Dec. 8, 2011

(30) Foreign Application Priority Data
Jun. 4, 2010 (CN) .......................... 2010 1 0192065

(51) Int. Cl.
*H05K 7/20* (2006.01)
(52) U.S. Cl.
USPC ...... 361/697; 361/679.47; 361/688; 361/695; 361/710; 361/715; 165/80.3; 165/104.33; 165/122; 165/185; 228/180.1; 228/119; 228/191; 228/264; 29/592.1; 29/726; 29/762; 29/840; 29/843; 29/890.031; 29/860
(58) Field of Classification Search
USPC ................ 361/601–712, 715–724; 165/80.2, 165/80.3, 80.4, 80.5, 104.33, 104.34, 104.14, 165/104.22, 185; 62/3.2, 3.6, 3.7, 259.2; 174/15.1, 15.3, 16.3, 252; 257/686, 99, 712, 257/81, 98, 773, 467, 497, 530; 374/43, 141, 374/164, 15; 228/9, 46, 180.1, 180.21, 119, 228/264; 29/592.1, 825–854, 890.03, 890.031, 29/890.033, 722, 726, 739, 750, 756, 762, 29/764
See application file for complete search history.

(56) References Cited

U.S. PATENT DOCUMENTS

| | | | | | |
|---|---|---|---|---|---|
| 4,752,025 | A | * | 6/1988 | Stach et al. | 228/9 |
| 5,006,796 | A | * | 4/1991 | Burton et al. | 324/750.11 |
| 5,040,381 | A | * | 8/1991 | Hazen | 62/3.2 |
| 5,200,810 | A | * | 4/1993 | Wojnarowski et al. | 361/750 |
| 5,430,322 | A | * | 7/1995 | Koyanagi et al. | 257/467 |
| 5,441,576 | A | * | 8/1995 | Bierschenk et al. | 136/203 |
| 5,572,407 | A | * | 11/1996 | Sobhani | 361/719 |
| 5,651,495 | A | * | 7/1997 | Tocher et al. | 228/123.1 |
| 5,690,849 | A | * | 11/1997 | DeVilbiss et al. | 219/497 |
| 5,842,353 | A | * | 12/1998 | Kuo-Liang | 62/190 |
| 6,023,932 | A | * | 2/2000 | Johnston | 62/3.5 |
| 6,039,471 | A | * | 3/2000 | Wyland | 374/43 |
| 6,068,175 | A | * | 5/2000 | Heim et al. | 228/45 |

(Continued)

*Primary Examiner* — Michail V Datskovskiy
(74) *Attorney, Agent, or Firm* — Altis Law Group, Inc.

(57) ABSTRACT

A cooling device for cooling electronic components includes a base plate, a power source, and a cooling module. The cooling module includes a cooling sheet and a thermal conductive base. The cooling sheet includes a hot surface and a cooling surface. The thermal conductive base is located above the cooling surface of the cooling sheet, and configured to support electronic components on a printed circuit board and transfer heat between the electronic components and the cooling surface. When the cooling sheet is powered on, the cooling surface is in a constant state of low temperature. Due to the heat transfer between the cooling surface and the thermal conductive base, heat from the electronic components can be transferred from the thermal conductive base to the cooling surface continuously.

7 Claims, 2 Drawing Sheets

U.S. PATENT DOCUMENTS

| | | | |
|---|---|---|---|
| 6,300,150 B1* | 10/2001 | Venkatasubramanian | 438/27 |
| 6,334,311 B1* | 1/2002 | Kim et al. | 62/3.2 |
| 6,410,971 B1* | 6/2002 | Otey | 257/467 |
| 6,591,615 B1* | 7/2003 | Luo | 62/3.7 |
| 6,970,007 B2* | 11/2005 | Miyakita | 324/750.11 |
| 7,095,187 B2* | 8/2006 | Young | 315/360 |
| 7,231,771 B2* | 6/2007 | McMurry et al. | 62/3.6 |
| 7,234,218 B2* | 6/2007 | Farooq et al. | 29/426.4 |
| 7,519,402 B2* | 4/2009 | Son | 455/575.1 |
| 7,595,992 B2* | 9/2009 | Koga | 361/719 |
| 7,997,087 B2* | 8/2011 | Venkatasubramanian et al. | 62/3.7 |
| 8,168,338 B2* | 5/2012 | Yamamiya | 429/403 |
| 2001/0013224 A1* | 8/2001 | Ohkubo et al. | 62/3.7 |
| 2002/0071223 A1* | 6/2002 | Ghoshal | 360/317 |
| 2003/0033818 A1* | 2/2003 | Kucherov et al. | 62/3.1 |
| 2003/0197518 A1* | 10/2003 | Miyakita | 324/750 |
| 2006/0048807 A1* | 3/2006 | Lee et al. | 136/205 |
| 2006/0255822 A1* | 11/2006 | Saito et al. | 324/760 |
| 2010/0257871 A1* | 10/2010 | Venkatasubramanian et al. | 62/3.7 |
| 2012/0018682 A1* | 1/2012 | Minami et al. | 252/514 |
| 2012/0031592 A1* | 2/2012 | Harada et al. | 165/135 |

* cited by examiner

COOLING DEVICE FOR COOLING ELECTRONIC COMPONENTS

BACKGROUND

1. Technical Field

The present disclosure relates to cooling devices and, more particularly, to a cooling device having a cooling module to cool electronic components.

2. Description of Related Art

Typically, electronic components are arranged on a printed circuit board (PCB) in a back-to-back manner to save space. When electronic components on one side of the PCB are damaged and need repairing, the electronic components on the opposite side may be damaged during the repair process. For example, when soldered connections of an electronic component are heated to remove the component, electronic components on the corresponding location on the opposite side of the PCB may be damaged by the heat and or disengage from the PCB.

It is desirable to provide a cooling device that includes a cooling module to cool the electronic components to solve the problems mentioned above.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The disclosure is illustrated by way of example and not by way of limitation. It should be noted that references to "an" or "one" embodiment in this disclosure are not necessarily to the same embodiment, and such references mean at least one.

Figure 1:
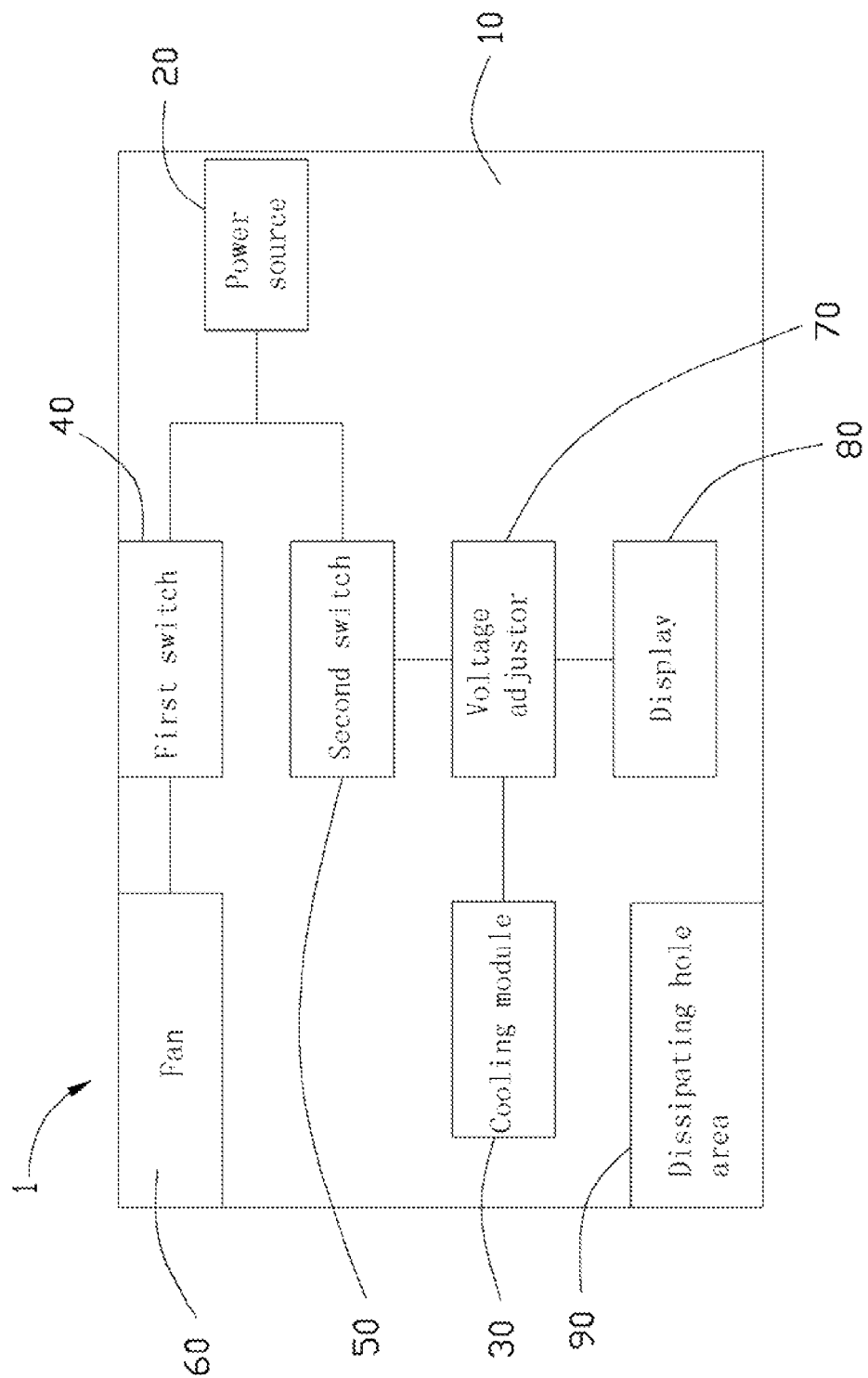
FIG. 1 is a block diagram of a cooling device for cooling electronic components in accordance with an exemplary embodiment.

Referring to FIG. 1, a cooling device 1 for cooling electronic components 201 of a printed circuit board (PCB) 200 in accordance with an exemplary embodiment is shown. In this embodiment, only two electronic components 201 on one side of the PCB 200 are Shown. The cooling device 1 includes a base plate 10, a power source 20, and a cooling module 30. The power source 20 and the cooling module 30 are arranged on the base plate 10, and the power source 20 is configured to provide power to the cooling module 30.

Figure 2:
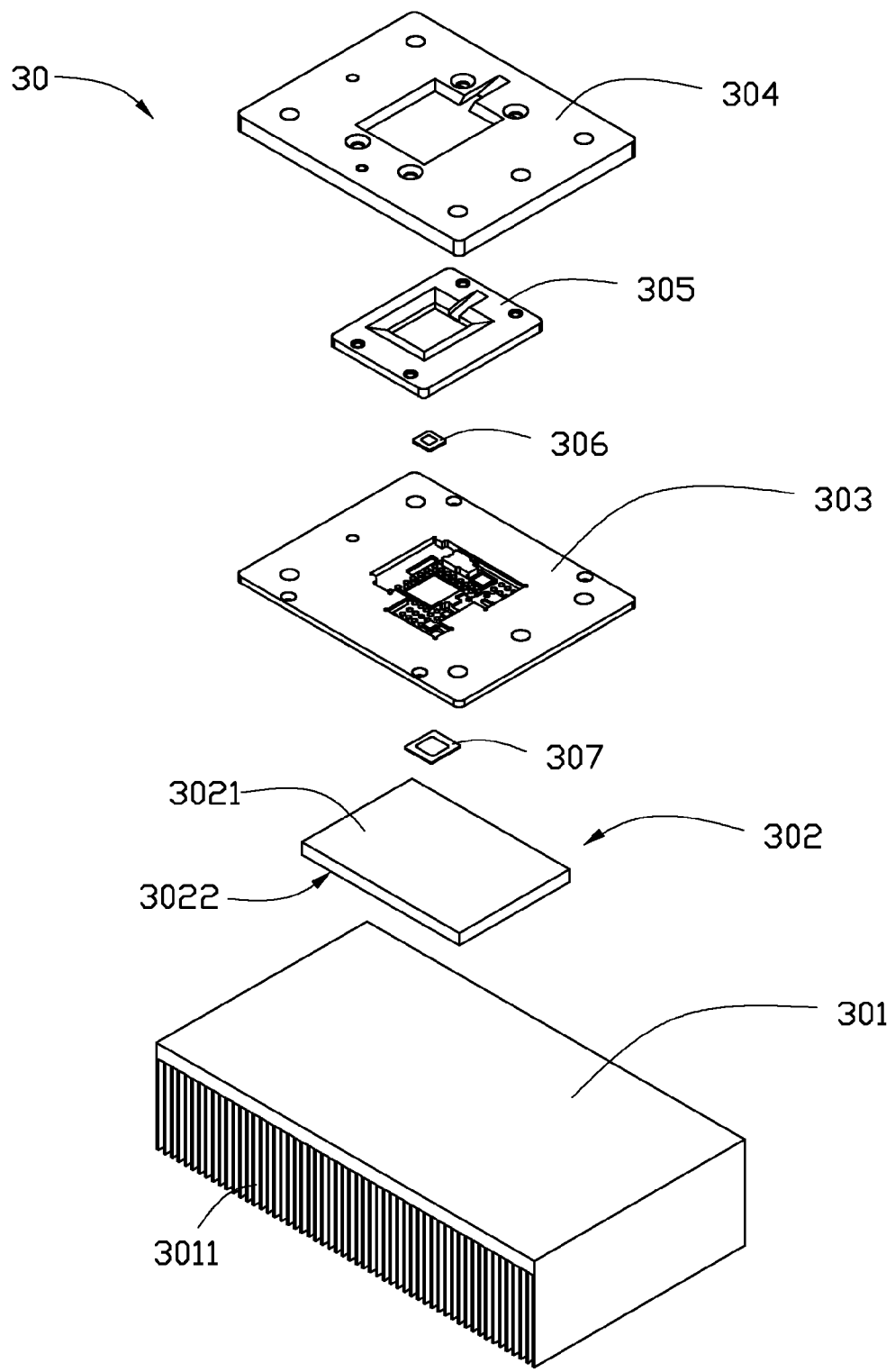
FIG. 2 is an exploded view of a cooling module of the cooling device of FIG. 1 for cooling the electronic components.

Referring to FIG. 2, the cooling module 30 includes a heat sink 301, a codling sheet 302, and a thermal conductive base 303. The heat sink 301 includes a number of 1ms 3011. The cooling sheet 302 is located above the heat sink 301 and includes a cooling surface 3021 staying in contact with the thermal conductive base 303, and a hot surface 3022 staying in contact with the heat sink 301. When the cooling sheet 302 is powered on, the cooling surface 3021 is in a constant state of low temperature, and the hot surface 3022 is in a constant state of high temperature. The thermal conductive base 303 is located above the cooling surface 3021 of the cooling sheet 302, and is used to support the electronic components 202 which need to be cooled and transfer heat between the electronic components 202 and the cooling surface 3021 The thermal conductive base 303 is made of metal having heat conductivity exceeding a preset value, such as iron, copper, etc. In the embodiment, the thermal conductive base 303 can be made of red copper.

When the electronic components 202 on one side of the PCB 200 need to be repaired, the PCB 200 can be orientated with the opposite side contacting the thermal conductive base 303 so that the electronic components 202 on the opposite side can be cooled by the cooling sheet 302 when the electronic components 202 needed to be repaired are heated up. If the cooling sheet 302 of the cooling module 30 is powered on, the cooling surface 3021 is in a constant state of low temperature, and the hot surface 3022 is in a constant state of high temperature. Due to the heat transfer between the cooling surface 3021 and the thermal conductive base 303, heat from the electronic components 202 can be transferred from the thermal conductive base 303 to the cooling surface 3021 continuously. Heat transfer also occurs between the hot surface 3022 and the heat sink 301 continuously.

Referring again to FIG. 1, the cooling device 1 further includes a fan 60 arranged on the base plate 10. A dissipating hole area 90 on the base plate 10 defines a number of heat dissipating holes (not shown). The fan 60 is electrically connected to the power source 20. The airflow from the fan 60 traverses through the cooling module 30 and comes out of the cooling device 1 from the heat dissipating holes. The heat transferred to the heat sink 301 of the cooling module 30 can thus be dissipated.

The cooling device 1 further includes a voltage adjustor 70 and a display 80. The voltage adjustor 70 is electrically connected to both the power source 20 and the cooling module 30. The voltage adjustor 70 is configured to adjust the working voltage of the cooling sheet 302 of the cooling module 30. Thus, the temperature of the cooling surface 3021 can be decreased/increased when the working voltage of the cooling sheet 302 is adjusted, and the speed of the heat conduction between the thermal conductive base 303 and the cooling surface 3021 can become faster/slower. The display 80 is configured to display the working voltage of the cooling sheet 302.

The cooling device 1 further includes a first switch 40 and a second switch 50. The first switch 40 is set between the power source 20 and the fan 60, and is used to actuate the fan 60. The second switch 50 is set between the power source 20 and the cooling sheet 302 of the cooling module 30, and is used to actuate the cooling sheet 302.

Referring again to FIG. 2, the cooling module 30 further includes a protective cover 304 and a heat shield 305. The protective cover 304 is made of material which is able to endure temperature exceeding a preset value, and is configured to cover and protect the other electronic components 202 around the electronic components 202 that need to be repaired. The heat shield 305 is configured to fit around the electronic component 202 to be heated and removed, and guide hot air to the electronic component 202 from a heating device (not, shown), while at the same time protecting nearby components 202 from the hot air.

The cooling module 30 further includes a first piece of silica gel 306 and a second piece of silica gel 307. The first piece of silica gel 306 is arranged between the PC.B 200 and the thermal conductive base 303, and is configured to improve the heat conductivity between the electronic components 201 and the thermal conductive base 303, The second piece of silica gel 307 is arranged between the thermal conductive base 303 and the cooling surface 3021 of the cooling sheet

302, and is configured to improve the heat conductivity between the thermal conductive base 303 and the cooling surface 3021.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A cooling device for cooling to-be-cooled electronic components on one side of a printed circuit board when electronic components on an opposite side of the printed circuit board need to be repaired, comprising:
   a base plate;
   a power source arranged on the base plate; and
   a cooling module arranged on the base plate, comprising:
      a heat sink;
      a cooling sheet comprising a hot surface in contact with the heat sink and a cooling surface, when the power source provides power to the cooling sheet, the cooling surface being in a constant state of low temperature, and the hot surface being in a constant state of high temperature; and
      a thermal conductive base located above the cooling surface and configured to support the to-be-cooled electronic components on the printed circuit board and transfer heat between the to-be-cooled electronic components and the cooling surface;
   wherein, heat from the to-be-cooled electronic components is transferred from the thermal conductive base to the cooling surface due to heat transfer between the thermal conductive base and the cooling sheet, and heat from the cooling surface to the hot surface is transferred to the heat sink, and the heat sink dissipates the heat from the hot surface.

2. The cooling device according to claim 1, wherein the thermal conductive base is made of metal having heat conductivity exceeding a preset value.

3. The cooling device according to claim 1, further comprising a first switch and a fan, wherein the first switch is set between the power source and the fan to actuate the fan.

4. The cooling device according to claim 1, further comprising a voltage adjustor and a display, wherein the voltage adjustor is electrically connected to both the power source and the cooling sheet of the cooling module, and the display is configured to display the working voltage of the cooling sheet.

5. The cooling device according to claim 1, further comprising a second switch, wherein the second switch is set between the power source and the cooling module to actuate the cooling module.

6. The cooling device according to claim 1, wherein the cooling module comprises a protective cover made of material able to endure temperature exceeding a preset value.

7. The cooling device according to claim 1, wherein the cooling module further comprises a first piece of silica gel and a second piece of silica gel, the first piece of silica gel is arranged between the printed circuit board and the thermal conductive base, and the second piece of silica gel is arranged between the thermal conductive base and the cooling surface of the cooling sheet.

* * * * *